United States Patent
Roberts

Patent Number: 5,126,279
Date of Patent: Jun. 30, 1992

[54] SINGLE POLYSILICON CROSS-COUPLED RESISTOR, SIX-TRANSISTOR SRAM CELL DESIGN TECHNIQUE

[75] Inventor: Gregory N. Roberts, Boise, Id.

[73] Assignee: Micron Technology, Inc., Boise, Id.

[21] Appl. No.: 559,540

[22] Filed: Jul. 23, 1990

Related U.S. Application Data

[63] Continuation of Ser. No. 286,068, Dec. 19, 1988, abandoned.

[51] Int. Cl.$^5$ ............................................. H01L 21/70
[52] U.S. Cl. .......................................... 437/52; 437/47; 437/48; 437/60; 437/200; 437/233; 437/918; 357/51
[58] Field of Search ............... 437/47, 48, 51, 52, 437/60, 191, 192, 195, 233, 235, 918, 200; 357/51; 365/148

[56] References Cited

U.S. PATENT DOCUMENTS

| | | | |
|---|---|---|---|
| 4,130,892 | 12/1978 | Gunckel, II et al. | 365/156 |
| 4,178,674 | 12/1979 | Liu et al. | 437/918 |
| 4,268,321 | 5/1981 | Meguro | 357/42 |
| 4,290,185 | 9/1981 | McKenny et al. | 437/60 |
| 4,408,385 | 10/1983 | Rao et al. | 437/918 |
| 4,451,328 | 5/1984 | Dubois | 437/918 |
| 4,481,524 | 11/1984 | Tsujide | 357/42 |
| 4,486,944 | 12/1984 | Hardee | 437/60 |
| 4,560,419 | 12/1985 | Bourassa et al. | 437/918 |
| 4,657,628 | 4/1987 | Holloway et al. | 156/644 |
| 4,740,479 | 4/1988 | Neppl et al. | 437/34 |
| 4,746,219 | 5/1988 | Holloway et al. | 437/200 |
| 4,762,801 | 8/1988 | Kapoor | 437/910 |
| 4,805,148 | 2/1989 | Diehl-Nagle et al. | 365/156 |
| 4,809,226 | 2/1989 | Ochoa, Jr. | 365/156 |

FOREIGN PATENT DOCUMENTS

| | | | |
|---|---|---|---|
| 0226549 | 6/1987 | European Pat. Off. | 437/918 |
| 0224195 | 11/1985 | Japan | 365/156 |
| 0208698 | 9/1986 | Japan | 365/156 |

*Primary Examiner*—Brian E. Hearn
*Assistant Examiner*—Tom Thomas
*Attorney, Agent, or Firm*—Stanley N. Protigal

[57] ABSTRACT

A six-transistor latch cell is formed with resistors connecting opposite nodes of the latch. A Salicide (self-aligned silicide) isolation mask layer (25) is used to permit the use of a single layer of polysilicon (23) to implant both the two resistors and the six transistors. The Salicide isolation mask (25) is provided to mask all high energy dopant implants in the poly resistor region and to function as a dielectric between the poly resistor and the local interconnect (27) passing above it. This Salicide isolation layer (25) is easy to manufacture, and adds very little to the vertical topology.

10 Claims, 9 Drawing Sheets

SINGLE POLYSILICON CROSS-COUPLED RESISTOR, SIX-TRANSISTOR SRAM CELL DESIGN TECHNIQUE

This is a continuation of U.S. patent application Ser. No. 286,068, filed Dec. 19, 1988, now abandoned.

FIELD OF THE INVENTION

This invention relates to semiconductor fabrication techniques, wherein a polysilicon layer used for form transistor gates is used to form resistors. The circuit relates to transistor latch cells and similar latch arrangements, and is intended to reduce soft errors which may be caused by alpha radiation hits, hit one portion of the cell. The invention finds utility in the fabrication of static random access memory arrays (SRAMs).

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

An efficient design technique to reduce SEU (single event upset) in static random access memory (SRAM) is to include two cross-coupled resistors in the memory cell. These two resistors introduce a sufficient response delay in the cross-coupled latch structure so that the affected storage node has enough time to recover from a foreign particle impact before that particle's charge can cause the latch to "lose" its data integrity. Refer to FIGS. 1 for a schematic of the six transistors and two resistors in the SRAM cell.

Historically, these cross-coupled resistors were fabricated out of a second layer of polysilicon while the six transistors were made with the first layer of polysilicon. While this approach is manufacturable, it does have several disadvantages. This is the result of the extra polysilicon layer adding considerable processing complexity. Furthermore, the second polysilicon layer significantly adds to the vertical topology, resulting in a more severe step coverage problem for the metallization process step.

BASIC CROSS-COUPLED RESISTOR CONCEPT

The cross-coupled resistor design concept has been used extensively over the past several years to dramatically reduce the SEU (single event upset) rate (also known as soft error rate—SER). A schematic representation of a cross-coupled resistor, 6T SRAM memory cell is shown in FIG. 1A. This includes the four-transistor storage latch shown in FIG. 1B. The circuit of FIGS. 1 function as follows:

In a typical situation, the storage cell may have a logical "1" (or 5 volts) stored on NODE A and a logical "0" (or 0 volts) stored on NODE B. The main purpose for the resistors is to create a delay path, or a resistor-capacitor (RC) time constant, between NODE B and NODE C and between NODE A and NODE D. To explain why a delay path is important, consider what occurs when a charged particle (such as an alpha particle) impacts on a storage node. In this example, consider an alpha particle "hit" on NODE A (which is at 5 volts). The charge stored on NODE A will be altered dramatically; that is the voltage may change from 5 volts down to 0 volts very quickly. If there was no resistor between NODE A to NODE D, then this altered voltage will quickly propagate from NODE A to NODE D.

NODE D is the gate potential for the CMOS inverter that drives NODE B. 0 volts on NODE D will cause the p-channel transistor (Q13) to turn on and the n-channel transistor (Q14) to turn off. This will cause NODE B to change from 0 volts to 5 volts if the altered voltage on NODE D lasts long enough. This will result in NODE A becoming 0 volts and NODE B becoming 5 volts, which is the opposite storage state of the cell prior to the alpha particle hit. The result is a single event upset or loss of data storage integrity.

By connecting resistors between opposite nodes of a four-transistor storage latch, the effect of the alpha particle hit is much different. As NODE A changes from 5 to 0 volts, the resulting RC time constant between opposite nodes (NODE A and NODE D) will delay the change in voltage on NODE D by several nanoseconds. Gate capacitance of transistors Q13 and Q14 and all parasitic capacitance is used in determining the RC time constant. Therefore, the RC time constant is determined by the resistor value and the total amount of capacitance on the transistor gate side of the connection (NODE D).

If this RC time constant is long enough so that the transistors Q11 and Q12 that drive NODE A can restore the logical "1" (5 volts) on NODE A before the altered "0" volts propagates to NODE D, then the cell will gracefully recover from the SEU without losing its data integrity. Therefore, NODE A will have to recover somewhat prior to the next cell access, otherwise, the alpha particle will overwhelm the p-CH transistor's ability to source current from VCC (temporarily). The voltage waveforms are as shown in FIGS. 2.

Looking at the "NO RESISTORS" graph (FIG. 2A), if NODE B changes state prior to any recovery on NODE A, then the cell will change state. However, if NODE D is delayed sufficiently from NODE A so that NODE A recovers before NODE D changes, then NODE B will stay in its logical "0" or 0 volt state. This is accomplished by incorporating the resistors, as shown in the "WITH RESISTORS" graph (FIG. 2B). The delay is accomplished through an RC time constant.

If this RC time constant is long enough, then the cell will gracefully recover from the single event upset (SEU) without losing its data integrity. If NODE B changes state prior to any recovery on NODE A, then the cell will change state. However, if NODE D is delayed sufficiently from NODE A so that NODE A recovers before NODE D changes, then NODE B will stay in its logical "0" or 0 volt state. In practice, the delay needs to be approximately 1.5-2.0 nanoseconds. Therefore, the poly resistor should be approximately 150,000 ohms.

The self-aligned silicide (also known as Salicide, twin-tub (STT) process has two key features that made it difficult to fabricate a single poly resistor: all diffusions and polysilicon are silicide with Ti (titanium); and a layer of TiN (titanium nitride) is used as local interconnect. To build a high resistance poly resistor, it is necessary to mask the poly during the silicide process. Also, due to cell layout constraints, a local interconnect layer must pass over the poly resistor without shorting to the resistor.

SUMMARY OF THE INVENTION

To solve the problem described above, a new mask layer was created called Salicide isolation. The Salicide isolation mask has two basic purposes: it will mask all high energy dopant implants in the poly resistor region (to maintain a high resistance poly resistor); and function as a dielectric between the poly resistor and the local interconnect passing above it.

This invention uses just one layer of polysilicon to implant both the two resistors and the six transistors. This cell design approach will be manufactured in a Salicide (self-aligned silicide) process which presented three major technical difficulties to be resolved: the polysilicon in the resistor region must be implanted with a different dopant dosage than the transistor polysilicon regions (to create a high-value resistor); the resistor polysilicon must not be silicided (to keep its high resistance value); and for a compact cell design it is necessary to pass a silicided interconnection layer over the polysilicon resistor region that is dielectrically isolated from the resistor region.

This invention solves the above difficulties by creating a Salicide isolation mask layer. This layer will protect the resistor from the high dose polysilicon implant, and provide a dielectric layer so that a local interconnect layer can pass over the resistor. This Salicide isolation layer is easy to manufacture, and adds very little to the vertical topology.

There are several major motivations behind the use of resistors in a SRAM cell design:

1) simpler processing—a smaller number of processing steps.

2) smaller topology—designing the cell with one layer of polysilicon instead of two layers results in a smaller vertical topology and makes the step coverage much easier for the metallization layer.

3) cross-coupled resistors—these resistors are used to significantly reduce the memory cell's sensitivity to single event upset (SEU).

4) utilize the present STT process—the Salicide twin-tub process is a simple, high speed process that is ideal for this product development.

This cell design will facilitate design of a six-transistor SRAM that will have high speed, simple processing, and a very low SEU rate. This low SEU rate makes this design ideal for memory applications which require high reliability.

Advantages to this cell design are:

1) ease of processing—using a SiO$_2$ layer to mask doping implants is straight forward.

2) reduced topography—a single layer polysilicon for both transistors and cross-coupled resistors reduces the vertical topology and creates better metallization step coverage.

3) retrofits into the existing process very easily.

4) creates a high quality cross-coupled resistor with just one extra mask step.

BRIEF DESCRIPTION OF THE DRAWINGS

FIG. 8 shows a cross section of a wafer, on which polysilicon is blanket deposited and a dopant implant is applied;

FIG. 9 shows patterning the polysilicon and formation of dielectric on the polysilicon;

FIG. 10 shows patterning of the dielectric layer to define a polysilicon resistor region;

FIG. 11 shows blanket implant to reduce resistance of the polysilicon not covered by the dielectric;

FIG. 12 shows blanket deposition of a refractory metal and establishment of a pattern of conductors from the refractory metal over the wafer;

FIG. 13 shows the formation of local interconnects by selective removal of TiN, showing the configuration of the circuit of FIG. 7.

DETAILED DESCRIPTION OF THE PREFERRED EMBODIMENT

Figure 1A:
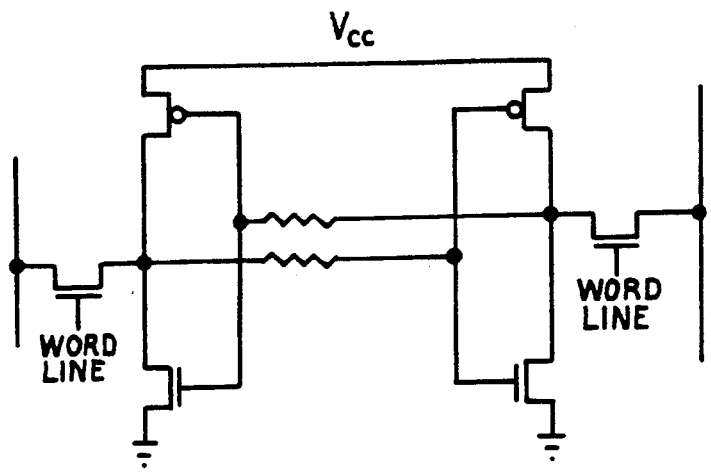
FIG. 1A schematically shows a six-transistor SRAM memory cell.
Figure 1B:
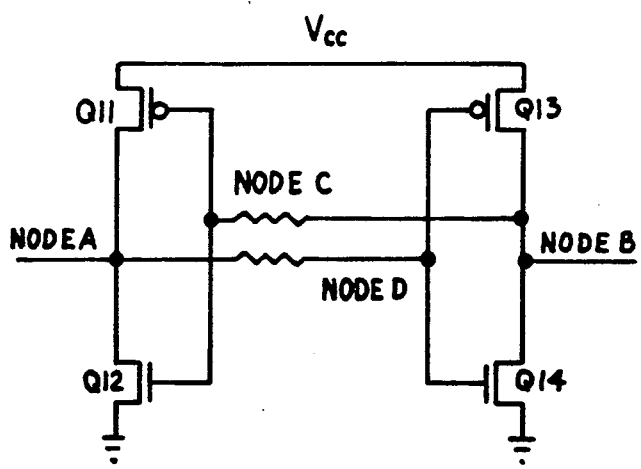
FIG. 1B schematically shows a storage latch portion of the 6-T cell of FIG. 1A.
Figure 2A:
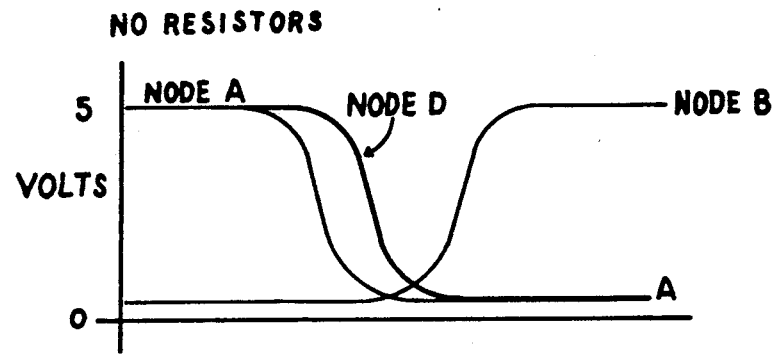
FIGS. 2A and 2B graphically show the after effects of an alpha "hit" without and with resistors in the cross-connections of a cell.
Figure 2B:
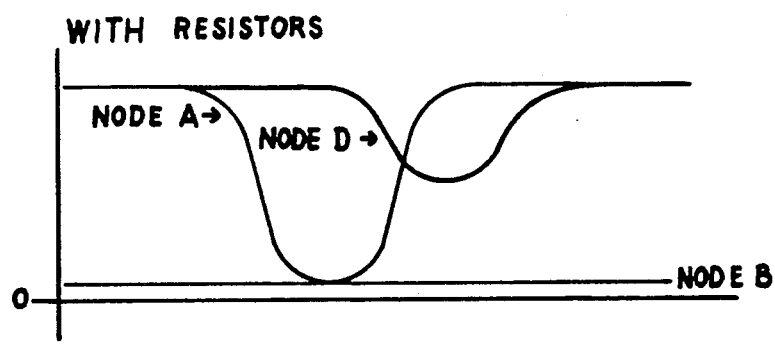
Figure 3:
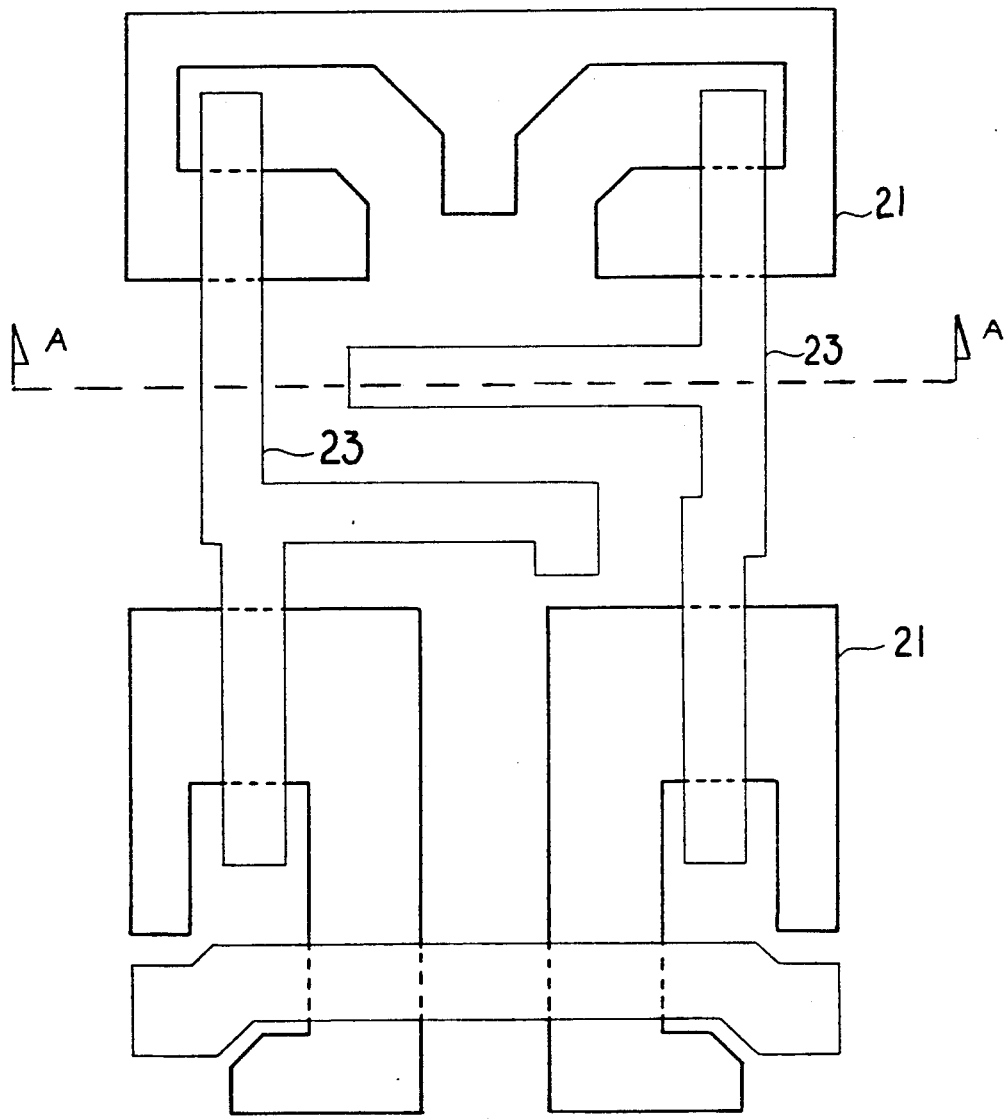
FIG. 3 is a top view of a portion of a semiconductor wafer, showing active area definition and deposition of polysilicon.

FIG. 3 shows the active area 21 (bold outline) and polysilicon 23 (thin line outline) layers, after patterning. Prior to poly etch, the blanket poly will be implanted to create a desired poly resistor resistance. A typical sheet resistively of approximately 50,000 ohms per square is effected. This is preferably done as a low dose, low energy blanket poly dopant implant. This sheet resistively will result in a total poly resistor resistance of approximately 150,000 ohms (which is the desired value).

Figure 4:
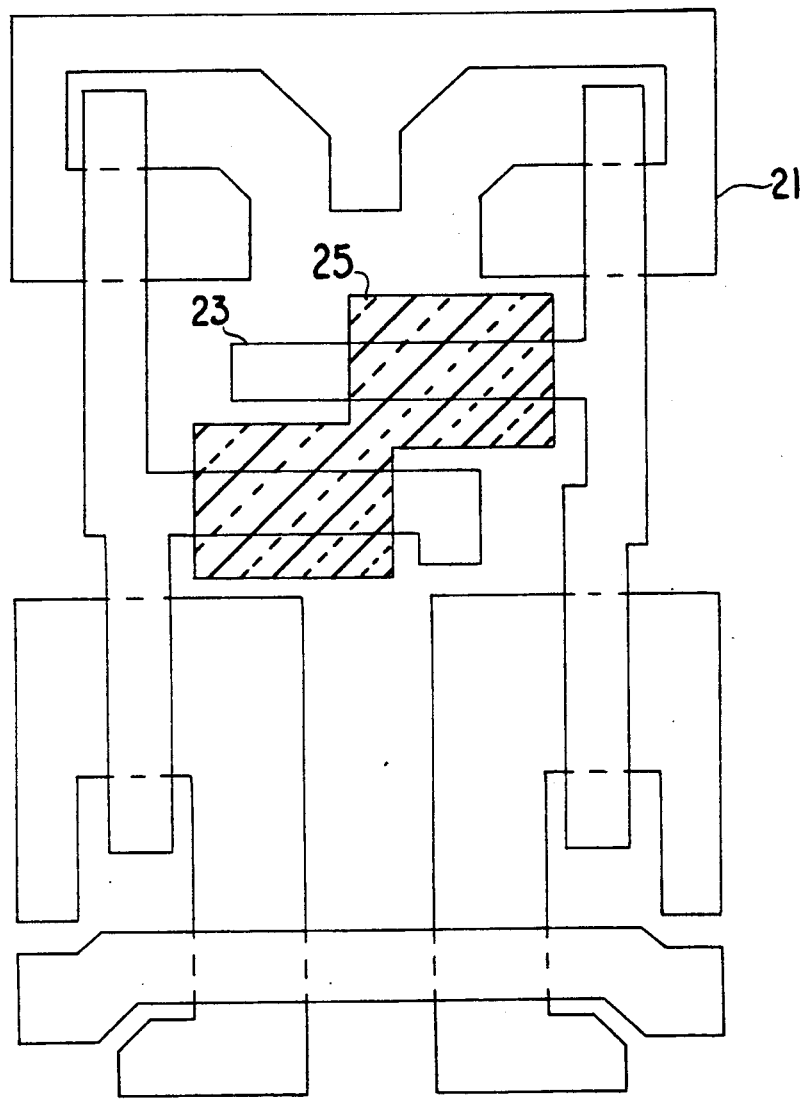
FIG. 4 shows the wafer portion subsequent to adding a Salicide isolation mask.

FIG. 4 shows the Salicide isolation mask 25 (solid and dashed lines). After poly patterning, a blanket layer of SiO$_2$ (silicon dioxide) is grown, and the Salicide isolation mask (at 25) will be used to etch off the SiO$_2$ everywhere except over the poly resistors. This results in a SiO$_2$ layer 25 over the poly, which will mask the resistors from receiving both the ensuing n+ doping and p+ doping implants. The poly resistors are where the Salicide isolation mask 25 covers the polysilicon 23.

Figure 5:
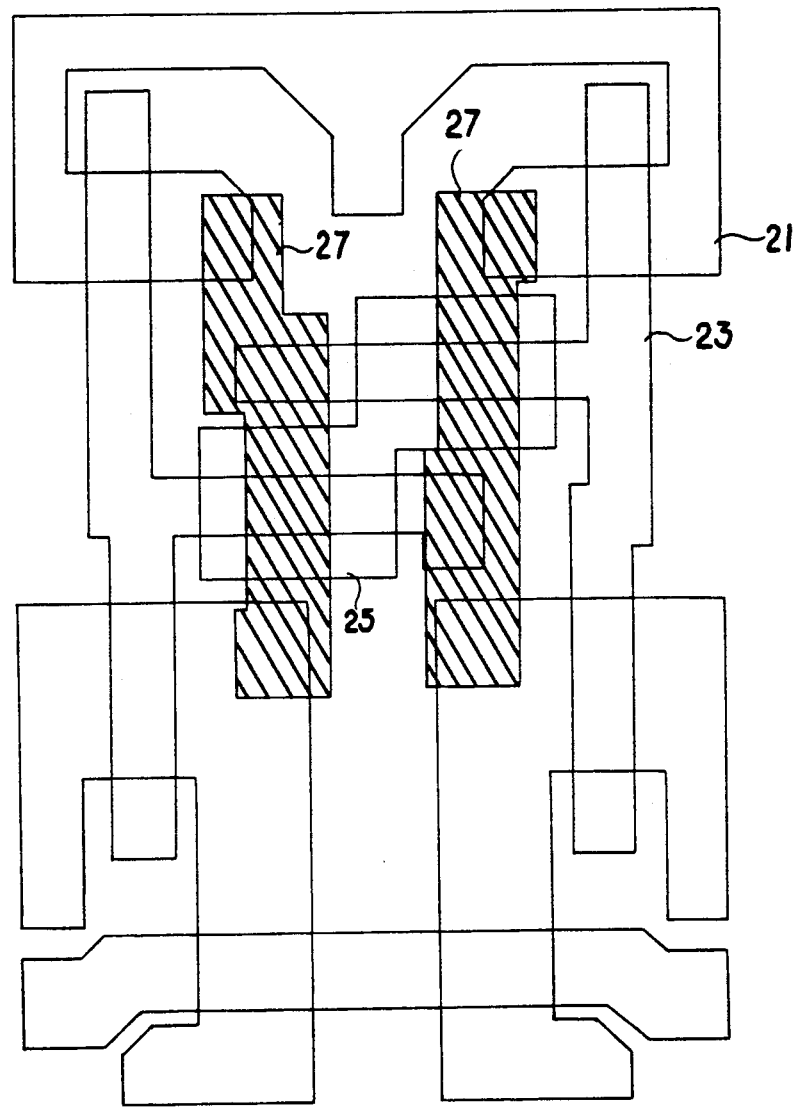
FIG. 5 shows the wafer portion subsequent to deposition of a local interconnect layer.

FIG. 5 shows how the local interconnect 27 (solid lines) passes over the poly resistors without shorting to the polysilicon below. The interconnect is made from a refractory conductive compound, such as titanium nitride (TiN). Titanium is sputtered onto the wafer and then is sintered in a nitrogen ambient. This step will automatically create TiSi$_2$ on the silicon areas, namely diffusion areas and polysilicon (except for that covered by SiO$_2$), and TiN everywhere else.

A thin layer of SiO$_2$ is then grown, followed by a local interconnect mask. The local interconnect mask is used to establish a pattern in the TiN. This removes the thin SiO$_2$ layer from all regions where there is no local interconnect. The nonmasked TiN is then etched off to create the local interconnect areas.

Normally local interconnects will automatically short to any exposed source of active area or poly; however, the Salicide isolation SiO$_2$ layer 25 forms a dielectric isolating layer between the poly 23 and the local interconnect 27.

Figure 6:
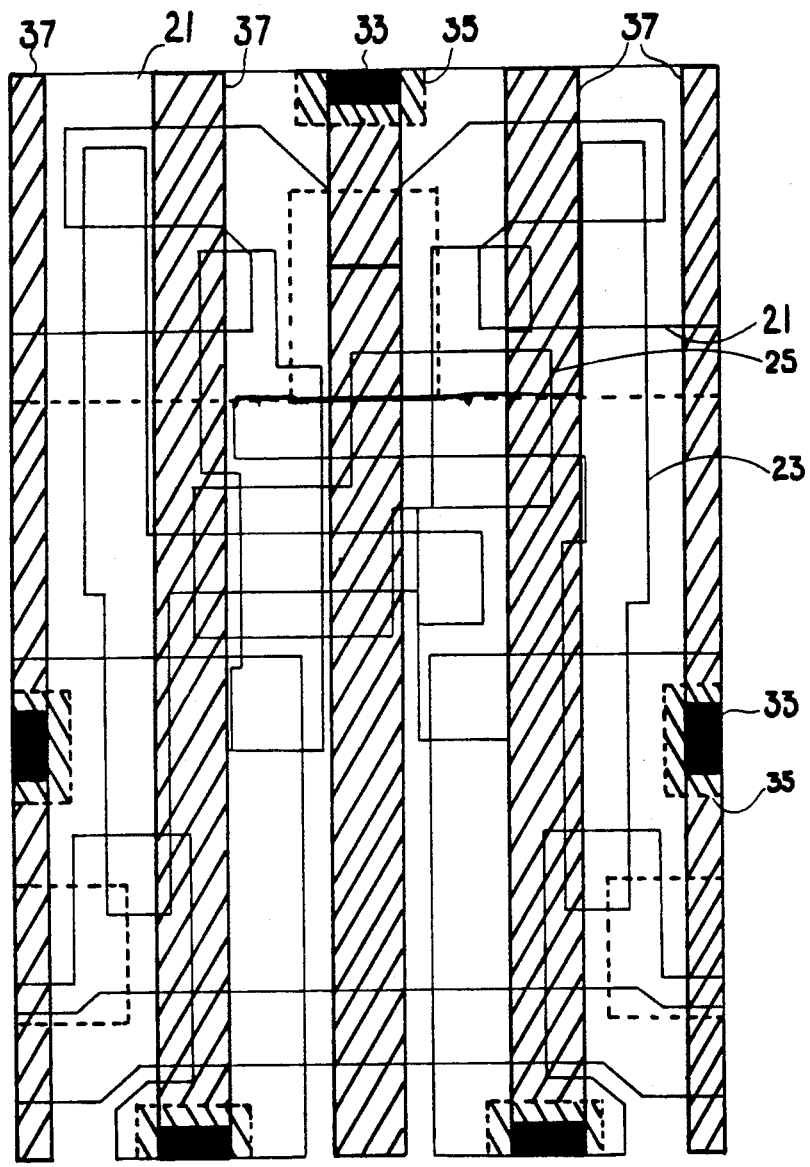
FIG. 6 shows the addition of implants and the metallization of the wafer.

Referring to FIG. 6, connections in the cell are established by establishing contacts 33 to diffused substrate material, along with metal caps 35. Metallized strips 37 are used to connect the cell to control circuitry (not shown).

Figure 7:
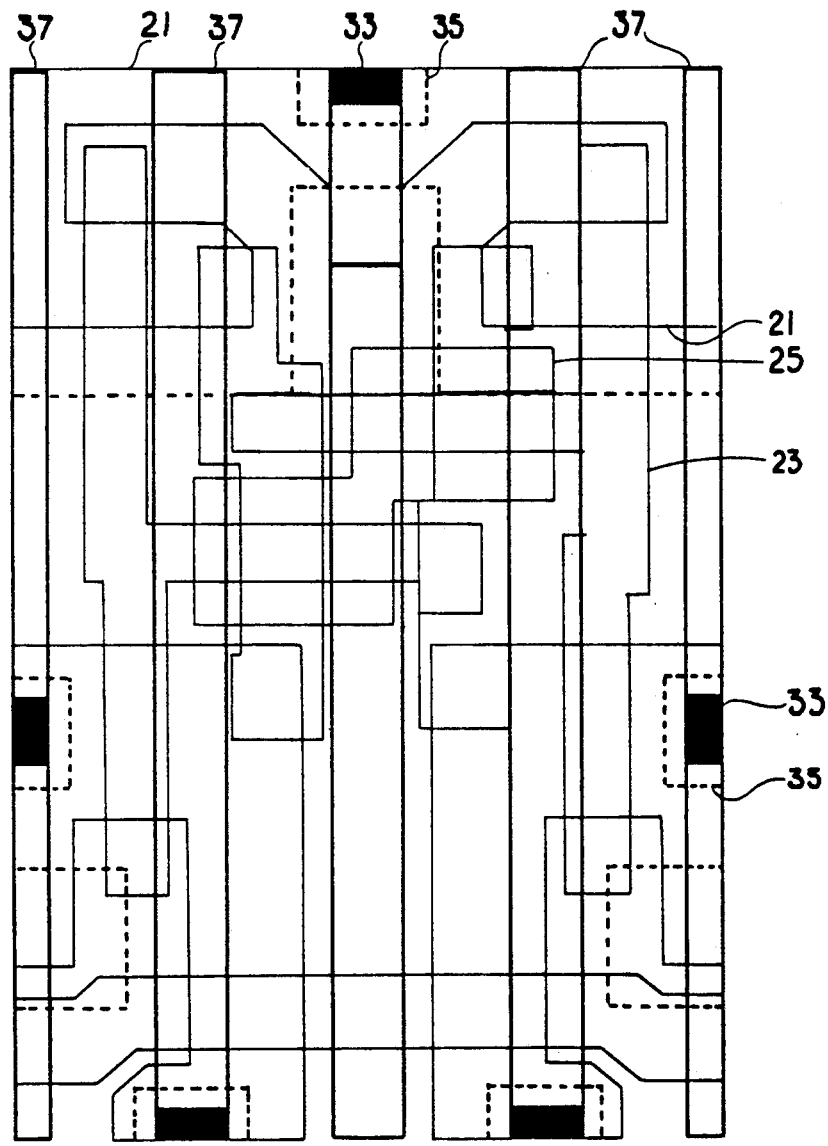
FIG. 7 shows the completed portion of the wafer.
Figure 8:
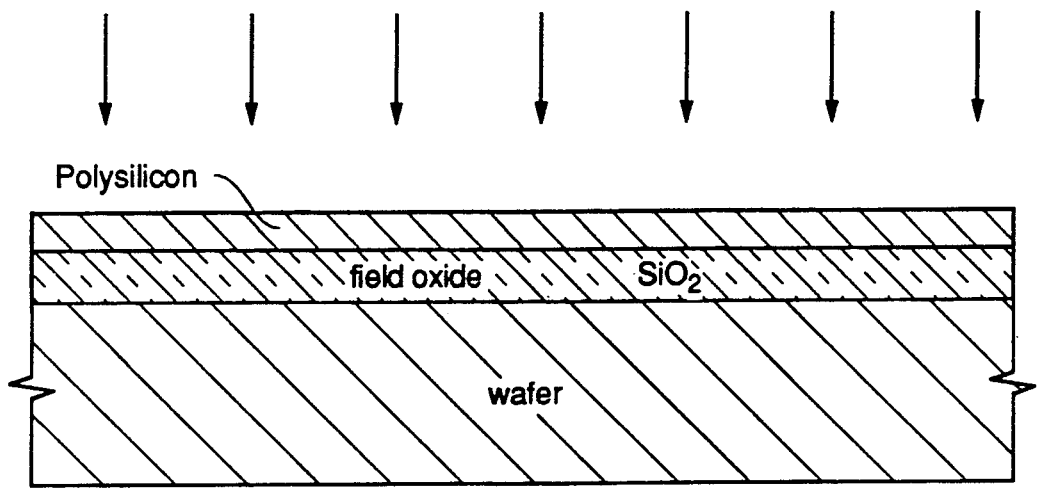
FIGS. 8–13 show a summary of the steps of the inventive process, in a cross section taken along line A—A of FIG. 3.
Figure 9:
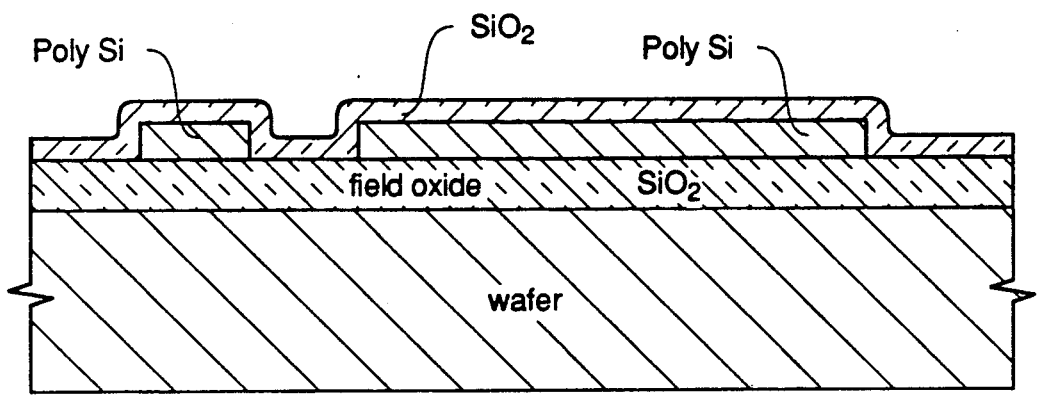
Figure 10:
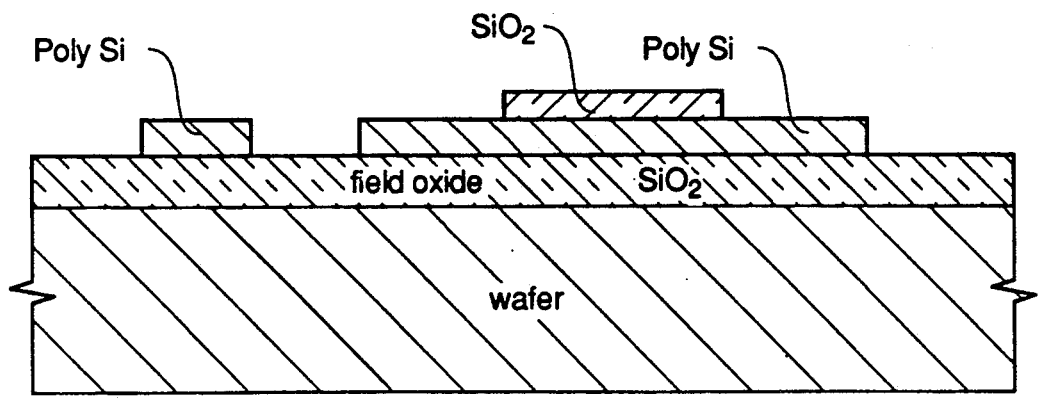
Figure 11:
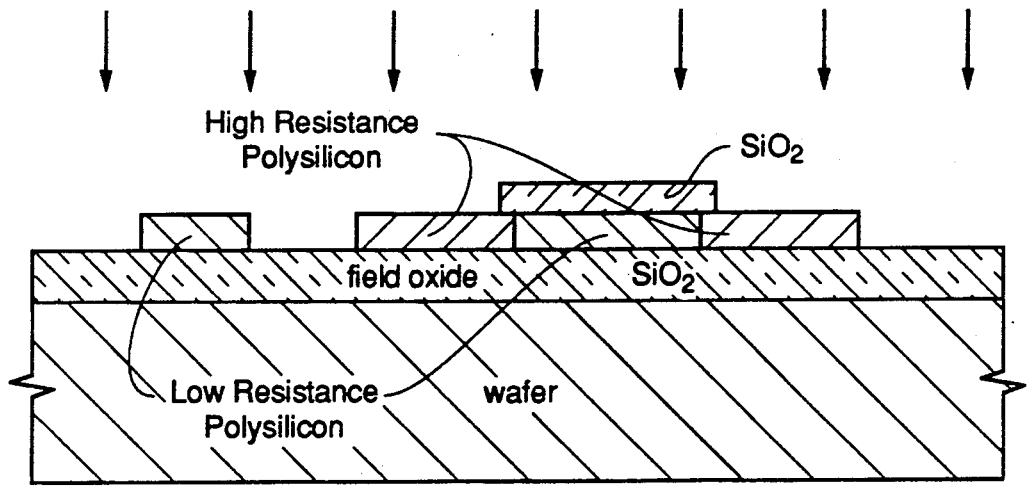
Figure 12:
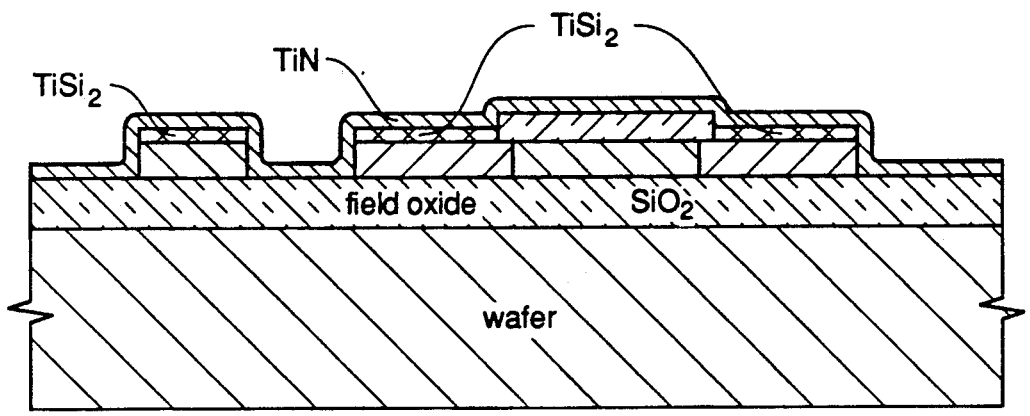
Figure 13:
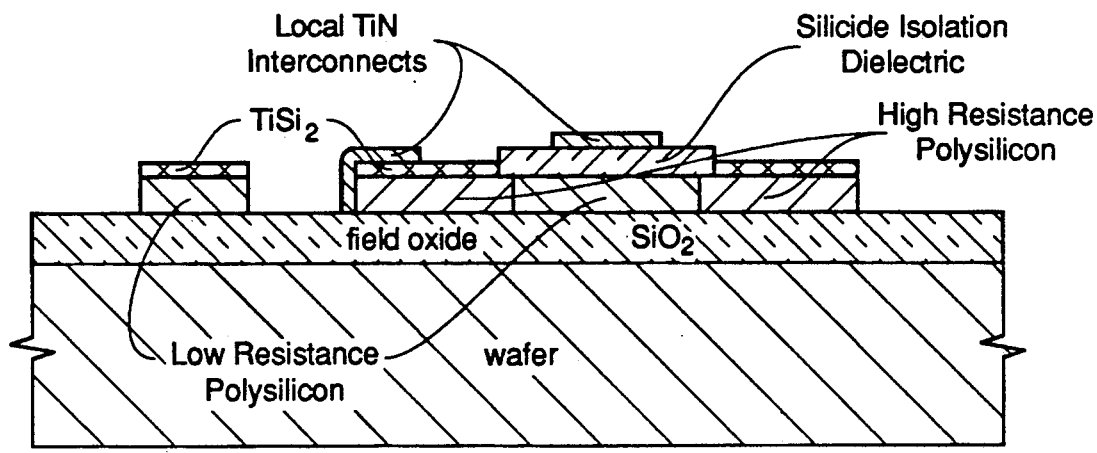

The completed cell is shown in FIG. 7.

PROCESS FLOW SUMMARY

1) Preparation of wafer, including defining active areas and implants.

2) Blanket poly deposition.

3) Low dose, low energy blanket poly dopant implant. The polysilicon is implanted with a low dose, low energy implant to create the desired poly resistor resistance. The substrate is usually doped by the wafer manufacturer.

4) Pattern the poly with the poly mask.

5) Blanket $SiO_2$ layer.

6) Pattern the $SiO_2$ layer with the Salicide isolation mask.

7) Standard n+ doping implant.

8) Standard p+ doping implant.

9) Blanket Ti deposition.

10) Sinter the Ti in a nitrogen ambient. This step will automatically create $TiSi_2$ on the silicon areas, namely diffusion areas and polysilicon (except for that covered by $SiO_2$), and TiN everywhere else.

11) Grow a thin layer of $SiO_2$.

12) Pattern the TiN, using a local interconnect mask.

This removes the thin $SiO_2$ layer from all regions where there is no local interconnect. The nonmasked TiN is then etched off to create the local interconnect areas.

I claim:

1. Method of fabricating a latch cell which includes transistors and resistors on a semiconductor substrate, arranged to form a pair of cross-coupled storage nodes, characterized by:
   a) preparation of wafer, including defining active areas and implants;
   b) blanket deposition of polysilicon;
   c) applying a dopant implant, the dosage and energy of said implant being selected to define resistor regions and establish poly resistors in resistor regions at a desired resistance;
   d) masking the polysilicon with a photomask;
   e) patterning the poly with the photomask;
   f) growing a blanket $SiO_2$ layer, the gates of the transistors and the resistors being formed from the $SiO_2$ layer;
   g) patterning the $SiO_2$ layer with a Salicide isolation mask, thereby forming a patterned $SiO_2$ layer, the pattern defining an area wherein the resistor regions are isolated;
   h) applying n+ doping implant and p+ doping implant, the patterned $SiO_2$ layer masking said doping implants in the resistor regions, thereby defining transistor sources and drains;
   i) blanket deposition of a refractory metal; and
   j) establishing a pattern of conductors from the refractory metal over the wafer, the pattern extending over the Salicide isolation mask, the pattern forming local interconnects, the patterned $SiO_2$ layer further functioning as a dielectric between the resistors and the local interconnects, whereby said Salicide isolation mask is used to define said patterning of the $SiO_2$ layer, the resistor regions, and selectively prevent silicidation, and the resistor regions form a part of local interconnects between the storage nodes and pairs of the transistor gates, the local interconnects cross-coupling the storage nodes, the resistor region cooperating with the transistor gates to establish a delay path between the storage nodes and the transistor gates.

2. Method as described in claim 1, further characterized by:
   said conductors being refractory silicide, wherein the refractory silicide is formed by chemically combining the refractory metal with silicon.

3. Method as described in claim 2, further characterized by:
   said refractory silicide being titanium silicide.

4. Method as described in claim 12, further characterized by:
   a) said refractory silicide being formed by sintering the refractory metal in a nitrogen ambient; and
   b) etching unreacted refractory metal and refractory nitride, thereby leaving a pattern of refractory silicide, the pattern of conductors comprising at least a portion of the refractory silicide.

5. Method as described in claim 4, further characterized by:
   a) patterning the TiN using a local interconnect mask;
   b) using said local interconnect mask pattern to remove said thin $SiO_2$ layer from regions where there is no local interconnect; and
   c) etching the unmasked TiN to create local interconnect areas.

6. Method as described in claim 5, further characterized by:
   a) the polysilicon in the resistor region being implanted with a different dopant dosage than the transistor polysilicon regions, thereby forming a resistor of a desired value;
   b) a portion of the polysilicon forming resistor regions not being silicided, thereby keeping a high resistance value; and
   c) a silicided interconnection layer being deposited over the polysilicon resistor portion, the silicided interconnection layer being dielectrically isolated from the resistor regions.

7. Method as described in claim 6, further characterized by:
   a) said resistors being formed to connect between opposite nodes of a four-transistor storage latch, the delay path establishing an RC time constant between opposite nodes, so that said RC time constant between opposite nodes (NODE A and NODE D) will delay the change in voltage on one of said opposite nodes (NODE D), with the RC time constant being determined by the resistor value and the total amount of capacitance on a transistor gate side of the connection; and
   b) said RC time constant being sufficient to permit transistors in the latch to restore a logical "1" to one node before an altered value on that node propagates to the opposite node.

8. Method of fabricating a latch cell which includes transistors and resistors on a semiconductor substrate, arranged to form a pair of cross-coupled storage nodes, each of said storage nodes having at least one pair of transistor gates which are passively connected, characterized by:

a) preparation of water, including defining active areas and implants;
b) blanket deposition of polysilicon;
c) applying a low dose, low energy blanket poly dopant implant, the dosage and energy of said implant being selected to define resistor regions and establish poly resistors in resistor regions at a desired resistance;
d) masking the polysilicon with a photomask;
e) patterning the poly with the photomask;
f) growing a blanket $SiO_2$ layer, the gates of the transistors and the resistors being formed from the $SiO_2$ layer;
g) patterning the $SiO_2$ layer with a Salicide isolation mask, the pattern defining an area wherein the resistor regions are isolated;
h) applying n+ doping implant and p+ doping implant, the patterned $SiO_2$ layer masking said doping implants in the resistor regions, thereby defining transistor sources and drains;
i) blanket Ti deposition;
j) sintering the Ti in a nitrogen ambient;
k) growing a thin layer of $SiO_2$;
l) patterning the TiN using a local interconnect mask;
m) using said local interconnect mask pattern to remove said thin $SiO_2$ layer from regions where there is no local interconnect; and
n) etching the unmasked TiN to create local interconnect area, wherein the patterned $SiO_2$ layer further functions as a dielectric between the resistors and the local interconnects, and said local interconnect mask is used to define said patterning of the $SiO_2$ layer, the resistor regions, and selectively prevent silicidation, and the resistor regions form a part of local interconnects between the storage nodes and pairs of the transistor gates, the local interconnects cross-coupling the storage nodes, the resistor region cooperating with the transistor gates to establish a delay path between the storage nodes and the transistor gates.

9. Method as described in claim 8, further characterized by:
a) the polysilicon in the resistor region being implanted with a different dopant dosage than the transistor polysilicon regions, thereby forming a resistor of a desired value;
b) a portion of the polysilicon forming resistor regions not being silicided, thereby keeping a high resistance value; and
c) a silicided interconnection layer being deposited over the polysilicon resistor portion, the silicided interconnection layer being dielectrically isolated from the resistor regions.

10. Method as described in claim 9, further characterized by:
a) said resistors being formed to connect between opposite nodes of a four-transistor storage latch, the delay path establishing an RC time constant between opposite nodes, so that said RC time constant between opposite nodes (NODE A and NODE D) will delay the change in voltage on one of said opposite nodes (NODE D), with the RC time constant being determined by the resistor value and the total amount of capacitance on a transistor gate side of the connection; and
b) said RC time constant being sufficient to permit transistors in the latch to restore a logical "1" on one node before an altered value on that node propagates to the opposite node.

* * * * *

UNITED STATES PATENT AND TRADEMARK OFFICE
CERTIFICATE OF CORRECTION

PATENT NO. : 5,126,279
DATED      : June 30, 1992
INVENTOR(S) : Gregory N. Roberts It is certified that error appears in the above-indentified patent and that said Letters Patent is hereby corrected as shown below:

Column 6, line 17, change "12" to read --21--.

Signed and Sealed this

Fifth Day of July, 1994

Attest:

BRUCE LEHMAN

*Attesting Officer*  *Commissioner of Patents and Trademarks*